United States Patent
Kobayashi et al.

(10) Patent No.: US 6,593,164 B2
(45) Date of Patent: *Jul. 15, 2003

(54) SILICON PHOTOELECTRIC CONVERSION DEVICE, METHOD OF MANUFACTURING THE SAME AND METHOD OF PROCESSING THE SAME

(75) Inventors: Hikaru Kobayashi, Kyoto (JP); Hideomi Koinuma, Suginami-ku (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

This patent is subject to a terminal disclaimer.

(21) Appl. No.: 10/193,210

(22) Filed: Jul. 12, 2002

(65) Prior Publication Data

US 2002/0185172 A1 Dec. 12, 2002

Related U.S. Application Data

(63) Continuation of application No. 09/691,071, filed on Oct. 19, 2000, now Pat. No. 6,433,269.

(30) Foreign Application Priority Data

Oct. 19, 1999 (JP) ............................................. 11-296217

(51) Int. Cl.$^7$ .................. H01L 31/0288; H01L 31/042; H01L 31/0392; H01L 31/18

(52) U.S. Cl. .......................... 438/57; 136/251; 136/256; 136/255; 136/258; 136/252; 257/53; 257/56; 257/65; 257/66; 257/461; 257/431; 438/96; 438/97; 438/98

(58) Field of Search ................................. 136/251, 256, 136/255, 258, 252; 257/53, 56, 65, 66, 461, 431; 438/96, 97, 98, 57

(56) References Cited

U.S. PATENT DOCUMENTS

| | | | | |
|---|---|---|---|---|
| 4,769,682 A | * | 9/1988 | Yang et al. | 136/258 |
| 5,100,519 A | * | 3/1992 | Tsubomura et al. | 205/234 |
| 6,433,269 B1 | * | 8/2002 | Kobayashi et al. | 136/261 |

FOREIGN PATENT DOCUMENTS

| | | |
|---|---|---|
| JP | 10-74753 | 3/1998 |
| JP | 2001-339084 A | * 12/2001 |

OTHER PUBLICATIONS

Y. Kuwano et al., "Photovoltaic Behavior of Amorphous Si:H and Si:F:H Solar Cell", IEEE (CH1644–4/81/0000–0698), pp. 698–703, 1981.

D.L. Staebler et al., "Reversible Conductivity Changes in Discharge–produced Amorphous Si", Applied Physics Letters, vol. 31, No. 4, pp. 292–294, Aug. 15, 1977.

(List continued on next page.)

*Primary Examiner*—Alan Diamond
(74) *Attorney, Agent, or Firm*—Nixon Peabody LLP; Donald R. Studebaker

(57) ABSTRACT

A cyano process of introducing cyano ions ($CN^-$) into an amorphous silicon layer is performed after the amorphous silicon layer has been formed over a substrate or after the layer has been exposed to light. For example, the substrate is immersed in an aqueous solution containing potassium cyanide (KCN) in a vessel. The cyano process eliminates factors (e.g., weak bonds, defects, and centers of recombination) of decrease in photoconductivity of the as-deposited amorphous silicon thin film, which are identifiable in the as-deposited film. As a result, the photoconductivity of the amorphous silicon layer is already higher than usual from the beginning and will hardly decrease even upon exposure to light.

5 Claims, 13 Drawing Sheets

OTHER PUBLICATIONS

Kobayashi et al., "Improvement of<indium–tin–oxide/silicon oxide/n–Si> junction solar cell characteristics by cyanide treatment," J. Appl. Phys., 81(11), pp. 7630–7634, Jun. 1, 1997.

Kobayashi et al., "Improvement of electrical characteristics of<indium–tin–oxide/silicon oxide/polycrystalline n–Si> solar cells by a KCN treatment," J. Electrochem. Soc. 144(8), pp. 2893–2897, Aug. 1997.

Kobayashi et al., "Studies on interface states at ultrathin SiO2/Si(100) interfaces by means of x–ray photoelectron spectroscopy under biases and their passivation by cyanide treatment", Journal of Applied Physics, 83(4), pp. 2098–2103, Feb. 15, 1998.

Kanazaki et al., Passivation of trap states in polycrystalline Si by cyanide treatment, Solid State Communications, 113, pp. 195–199, Dec. 9, 1999.

* cited by examiner

↓ cyano process dangling bond

SILICON PHOTOELECTRIC CONVERSION DEVICE, METHOD OF MANUFACTURING THE SAME AND METHOD OF PROCESSING THE SAME

BACKGROUND OF THE INVENTION

The present invention relates to a method of processing a semiconductor device made of silicon and a method of fabricating the device, and more particularly relates to suppressing the degradation of the device due to Staebler-Wronski (S-W) effects.

As disclosed by D. L. Staebler, C. R. Wronski in Applied Physics Letters, 31, No. 4, p. 292, 1977, it is known that the electrical conductivity of silicon when exposed to light (which will be herein referred to as "photoconductivity") and the electrical conductivity thereof in the absence of light (which will be herein referred to as "dark conductivity") both decrease rapidly with time. This phenomenon is called "S-W effect degradation". The photoelectric conversion efficiency of a solar cell decreases as the electrical conductivity (i.e., photoconductivity) of amorphous silicon decreases. Thus, it is important to minimize the decrease.

In view of this inevitable phenomenon, the following methods are employed to suppress the decrease in photoconductivity of amorphous silicon.

In a first method, $SiD_4$ is used instead of silane gas ($SH_4$) when an amorphous silicon film is formed by a chemical vapor deposition method (CVD). This method is taught by, for example, Koji Dairiki, Seiichi Suzuki, Akira Yamada, Makoto Konagai in Technical Digest of the International PVSEC-9. p. 373, 1996.

In a second method, $SiF_4$ is used instead of silane gas during a CVD process. This method is taught by, for example, Y. Kuwano, M. Ohnisi, H. Nishiwaki, S. Tsuda, H. Shibuya, S. Nakano in Proceeding of $15^{th}$ IEEE Photovoltaic Specialists Conference, p. 698.

In a third method, a pinpin structure with double pin junctions is formed to reduce the thickness of an i-layer between p- and n-layers and, thereby suppress the S-W effect degradation.

However, the above-mentioned methods have the following drawbacks.

In the first method, the cost increases because $SiD_4$ is expensive. In addition, although the exposure-induced change of photoconductivity is suppressible to some degree, it is still impossible to completely eliminate the change of photoconductivity.

In the second method, when $SiF_4$ is used, electrical discharge power needed for forming amorphous silicon is almost ten times as high as the power needed when silane gas is used. In addition, the resultant film is likely to have impurities mixed in and the properties of the film easily deteriorate. Furthermore, the film easily peals off.

In the third method, the fabricating cost to form the pinpin structure is much higher than usual, and yet the resultant device cannot eliminate the S-W effect degradation.

The S-W effect degradation phenomenon is also observable in polysilicon, microcrystalline silicon, and single crystalline silicon. It is known that microcrystalline silicon and polysilicon, for example, have a large number of silicon dangling bonds especially in grain boundaries. Single crystalline silicon also has dangling bonds if the single crystalline silicon is amorphized as a result of ion implantation, for example, and cannot recover fully to its original state. Accordingly, if amorphous silicon, polysilicon, microcrystalline silicon or single crystalline silicon is used as a material for a photoelectric conversion device such as solar cell or optical sensor, the optical characteristics of the device such as the photoelectric conversion efficiency thereof might deteriorate.

SUMMARY OF THE INVENTION

An object of the present invention is providing methods of processing and fabricating a photoelectric conversion device having high conversion efficiency at a practical cost. In order to achieve this object, the present invention takes various measures to readily eliminate defects that cause S-W effect degradation in amorphous silicon, polysilicon, single crystalline silicon and microcrystalline silicon, for example.

A silicon photoelectric conversion device according to the present invention comprises: a silicon layer containing CN groups; and a conductor layer provided either over or under the silicon layer.

According to the present invention, defects such as dangling bonds, weak bonds and strained bonds in the silicon layer are replaced by CN groups. Thus, even if carriers have been activated upon exposure to light, the silicon layer has almost no defects that can be centers of recombination. As a result, a device such as solar cell, optical sensor and (electrophotographic) photoreceptor with good characteristics is realized. This is because the device includes the silicon layer with much improved properties (e.g., photoconductivity) that will hardly deteriorate with time even upon exposure to light.

In one embodiment of the present invention, the silicon layer is preferably made of at least one material selected from the group consisting of amorphous silicon, polysilicon, microcrystalline silicon and single crystalline silicon.

In another embodiment, the conductor layer may be a lower conductor electrode for a solar cell, and the device may further comprise an upper conductor electrode provided on the silicon layer. In such an embodiment, a solar cell with a photoelectric conversion efficiency, which will not decrease but can be kept sufficiently high even after exposure to light, can be obtained.

Instill another embodiment, the device may further comprise a lower semiconductor layer interposed between the lower conductor electrode and the silicon layer. In such an embodiment, the absorption spectrum of the device can be broadened. Thus, the photoelectric conversion efficiency of the device further increases.

In this particular embodiment, the lower semiconductor layer may be made of at least one material selected from the group consisting of p- or n-microcrystalline silicon, p- or n-amorphous silicon, p- or n-polysilicon and p- or n-single crystalline silicon.

In yet another embodiment, the device preferably further comprises an upper semiconductor layer interposed between the upper conductor electrode and the silicon layer.

In this particular embodiment, the upper semiconductor layer may also be made of at least one material selected from the group consisting of p- or n-microcrystalline silicon, p- or n-amorphous silicon, p- or n-polysilicon and p- or n-single crystalline silicon.

In yet another embodiment, one of the lower and upper conductor electrodes may be made of a conductor which is transparent to sunlight, and the other electrode may be made of a conductor which is opaque to sunlight. Then, the absorption efficiency of sunlight increases.

Instill another embodiment, the device may further comprise an insulator layer interposed between the silicon layer and the conductor layer. Then, the present invention is applicable to various kinds of devices such as a thin film transistor (TFT).

In this particular embodiment, the insulator layer is preferably made of at least one material selected from the group consisting of silicon dioxide ($SiO_2$), silicon monoxide (SiO), trisilicon tetranitride ($Si_3N_4$), silicon oxynitride, titanium dioxide ($TiO_2$), aluminum trioxide ($Al_2O_3$) and tungsten trioxide ($WO_3$).

An inventive method of fabricating a silicon photoelectric conversion device comprises the steps of: a) forming a silicon layer over a substrate made of a conductor, a semiconductor or an insulator; and b) performing a cyano process that introduces cyano ions ($CN^-$) into the silicon layer.

According to the present invention, cyano ions ($CN^-$) enter the silicon layer. As a result, defects such as dangling bonds in the silicon layer are terminated with the cyano ions, and the weak bonds and strained bonds are replaced by CN groups. Thus, even if carriers have been activated upon exposure to light, the silicon layer has almost no defects that can be centers of recombination. As a result, a device, including a silicon layer with much improved properties (e.g., photoconductivity) that will hardly deteriorate with time even upon exposure to light, can be fabricated.

In one embodiment of the present invention, at least one layer selected from the group consisting of an amorphous silicon layer, a polysilicon layer, a microcrystalline silicon layer and a single crystalline silicon layer is preferably formed in the step a) as the silicon layer.

In this case, it is the simplest way that the substrate is entirely immersed in a solution containing cyano ions ($CN^-$) in the step b).

In another embodiment, the substrate may be made of an insulator. The method may further comprise the step of forming a lower conductor electrode on the substrate before the step a) is performed. And in the step a), the silicon layer may be formed on the lower conductor electrode.

Instill another embodiment, the method may further comprise the step of forming an upper conductor electrode on the silicon layer after the step b) has been performed or before the step b) is performed.

Instill another embodiment, the method may further comprise the step of forming a lower semiconductor layer over the substrate before the step a) is performed. And in the step a), the silicon layer may be formed on the lower semiconductor layer.

In this particular embodiment, the method may further comprise the step of forming a lower conductor electrode on the substrate before the step a) is performed. And in the step a), the lower semiconductor layer may be formed on the lower conductor electrode.

In an alternative embodiment, the method may further comprise the step of forming an upper conductor electrode on the silicon layer after the step b) has been performed or before the step b) is performed.

In yet another embodiment, the method may further comprise the step of forming an upper semiconductor layer on the silicon layer after the step a) has been performed and before the step b) is performed. And in the step b), a cyano process may be performed on the upper semiconductor layer.

In this case, the method may also further comprise the steps of forming the lower conductor electrode and the lower semiconductor layer as described above.

In yet another embodiment, the method may further comprise the step of forming an insulator layer on the silicon layer after the step a) has been performed. Then, the present invention is applicable to various kinds of devices such as a TFT.

In this particular embodiment, the method may further comprise the step of forming a conductor electrode on the insulator layer after the step b) has been performed.

In yet another embodiment, the method may further comprise the step of exposing the silicon layer to light after the step a) has been performed and before the step b) is performed.

An inventive method of processing a silicon photoelectric conversion device comprises the steps of: a) preparing a substrate to be processed including a silicon layer; b) preparing a process solution containing cyano ions ($CN^-$); and c) performing a cyano process for introducing the cyano ions ($CN^-$) into the silicon layer of the substrate using the solution.

According to the present invention, $CN^-$ ions act on defects in the silicon layer of the substrate as described above. Thus, various properties of silicon such as photoelectric conversion efficiency can be improved.

In one embodiment of the present invention, the substrate to be prepared in the step a) preferably includes, as the silicon layer, at least one layer selected from the group consisting of an amorphous silicon layer, a polysilicon layer, a microcrystalline silicon layer and a single crystalline silicon layer.

In this case, it is the simplest way that the substrate is immersed in the solution in the step c).

In yet another embodiment, the substrate may further include an upper semiconductor layer formed on the silicon layer. And in the step c), the cyano process may be performed on the upper semiconductor layer.

In still another embodiment, even if the silicon layer of the substrate has been exposed to light before the step c) is performed, the silicon layer in which S-W degradation occurs can recover its photoconductivity.

DESCRIPTION OF PREFERRED EMBODIMENTS

Embodiment 1

FIGS. 1A through 1D are cross-sectional views illustrating a process of forming an amorphous silicon thin film as a component of a device according to a first embodiment of the present invention. In this embodiment, it will be described how to form an amorphous silicon thin film in such a manner that S-W effect degradation is suppressed by exposing the film to a compound having cyano ions (CN$^-$), i.e., cyanide.

Figure 1A:
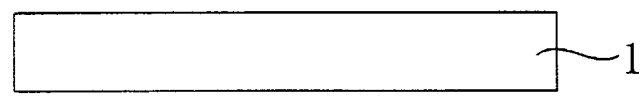
FIGS. 1A through 1D are cross-sectional views illustrating a process of forming an amorphous silicon thin film as a component of a solar cell according to a first embodiment of the present invention.

First, in the step shown in FIG. 1A, a glass substrate 1 is prepared and the principal surface of the glass substrate 1 is cleaned.

Figure 1B:
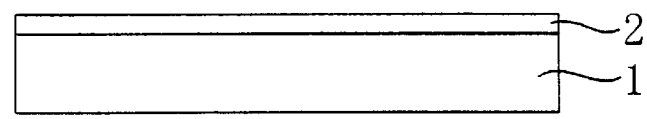

Next, in the step shown in FIG. 1B, the glass substrate 1 is placed in a plasma CVD chamber (not shown). Then, the chamber is evacuated to reduce the pressure to a range from $10^{-6}$ Pa to $10^{-8}$ Pa. Then, silane gas (SiH$_4$) is supplied into the chamber so that the in-chamber pressure increases to about 13 Pa. Subsequently, power is applied to an electrode for generating plasma at a radio frequency of 13.56 MHz, thereby generating a plasma. In this case, the RF power is set to about 0.04W cm$^{-2}$ and the temperature of the substrate is kept at about 250° C. As shown in FIG. 1B, after about 60 minutes of reaction, an i(intrinsic)-type amorphous silicon thin film 2 with a thickness of about 500 nm is formed on the glass substrate 1. The amorphous silicon thin film 2 formed by this discharge process has dangling bonds which are terminated with hydrogen. In other words, the amorphous silicon thin film is made of so called hydrogenated amorphous silicon.

Figure 1C:
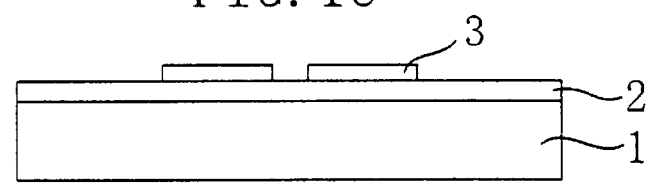

Then, in the step shown in FIG. 1C, a substrate to be processed is unloaded from the plasma CVD chamber and is placed in a vacuum evaporation chamber. Alternatively, CVD and vacuum evaporation maybe conducted in the same chamber. Then, in the vacuum evaporation chamber, two T-aluminum electrodes 3 for measuring electrical conductivity are formed on the i-amorphous silicon thin film 2 by a vacuum evaporation process. In this case, a gap between the T-aluminum electrodes 3 is set to 0.1 mm.

Figure 1D:
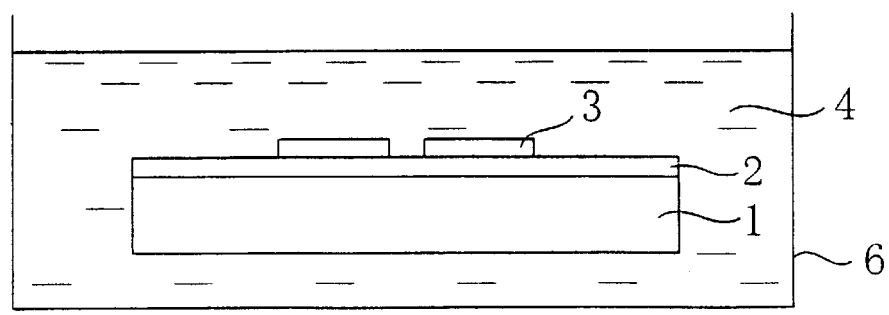

Subsequently, in the step shown in FIG. 1D, the substrate to be processed is unloaded from the vacuum evaporation chamber and is immersed in an aqueous solution 4 containing potassium cyanide (KCN) at a concentration of 0.01 mole and at a temperature of 25° C. in a vessel 6. Then, the substrate is immersed in ultrapure water at a temperature of 100° C. to be cleaned for ten minutes. This process will be herein referred to as a "cyano process".

In the cyano process, any other cyanide such as sodium cyanide (NaCN) may substitute for potassium cyanide (KCN). Also, the step shown in FIG. 1C may be performed to form the T-aluminum electrodes 3 after the cyano process is performed.

Figure 2:
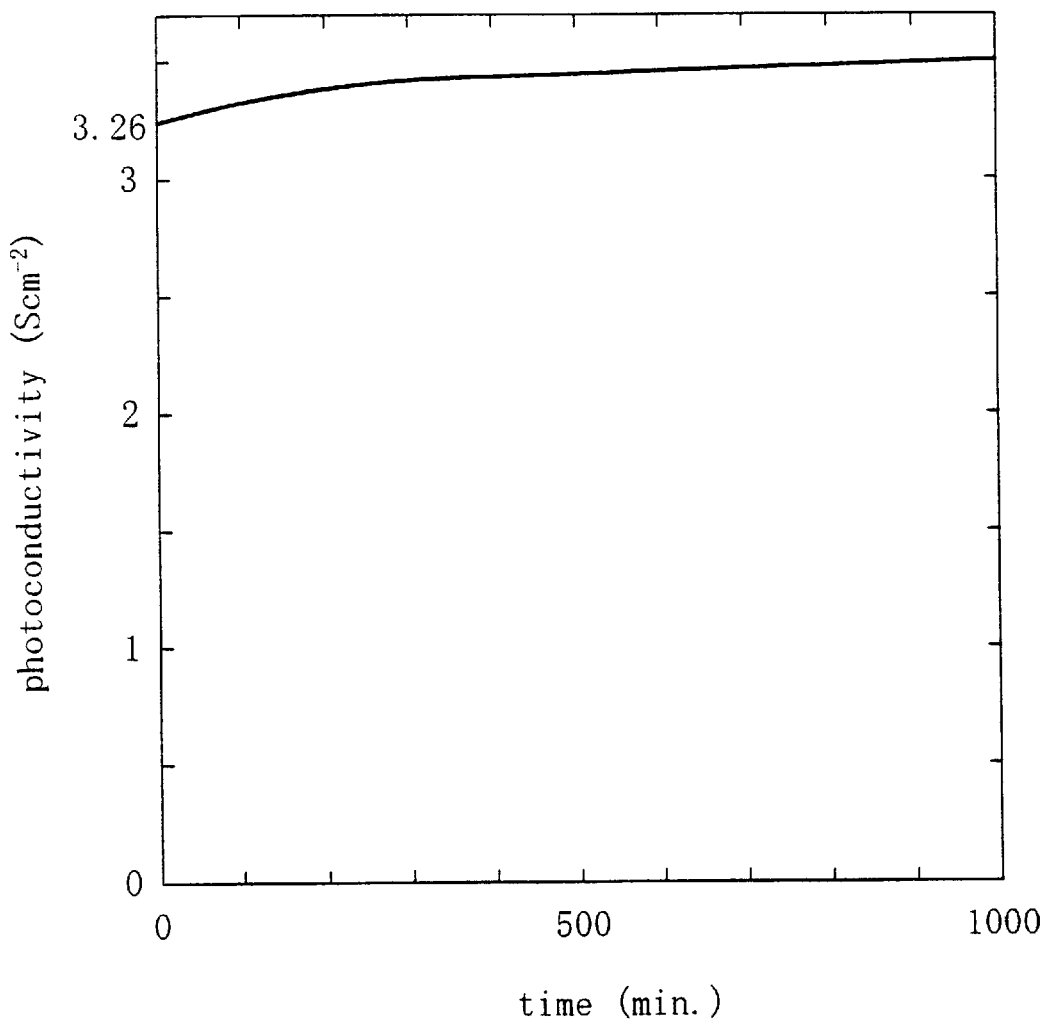
FIG. 2 is a graph showing a relationship between the photoconductivity of an amorphous silicon thin film subjected to a cyano process and exposure time according to the first embodiment.

FIG. 2 is a graph showing a variation in photoconductivity of an amorphous silicon thin film subjected to the cyano process according to this embodiment. In FIG. 2, the abscissa represents exposure time (minutes), while the ordinate represents photoconductivity (S cm$^{-2}$). The photoconductivity herein means electrical conductivity of silicon when exposed to light. The exposure radiation is pseudo sunlight AM 1.5 with an intensity of 100 mWcm$^2$. As shown in FIG. 2, when the cyano process is performed after the formation of an amorphous silicon thin film, the photoconductivity of the amorphous silicon thin film hardly changes even upon the exposure to the light.

Figure 3:
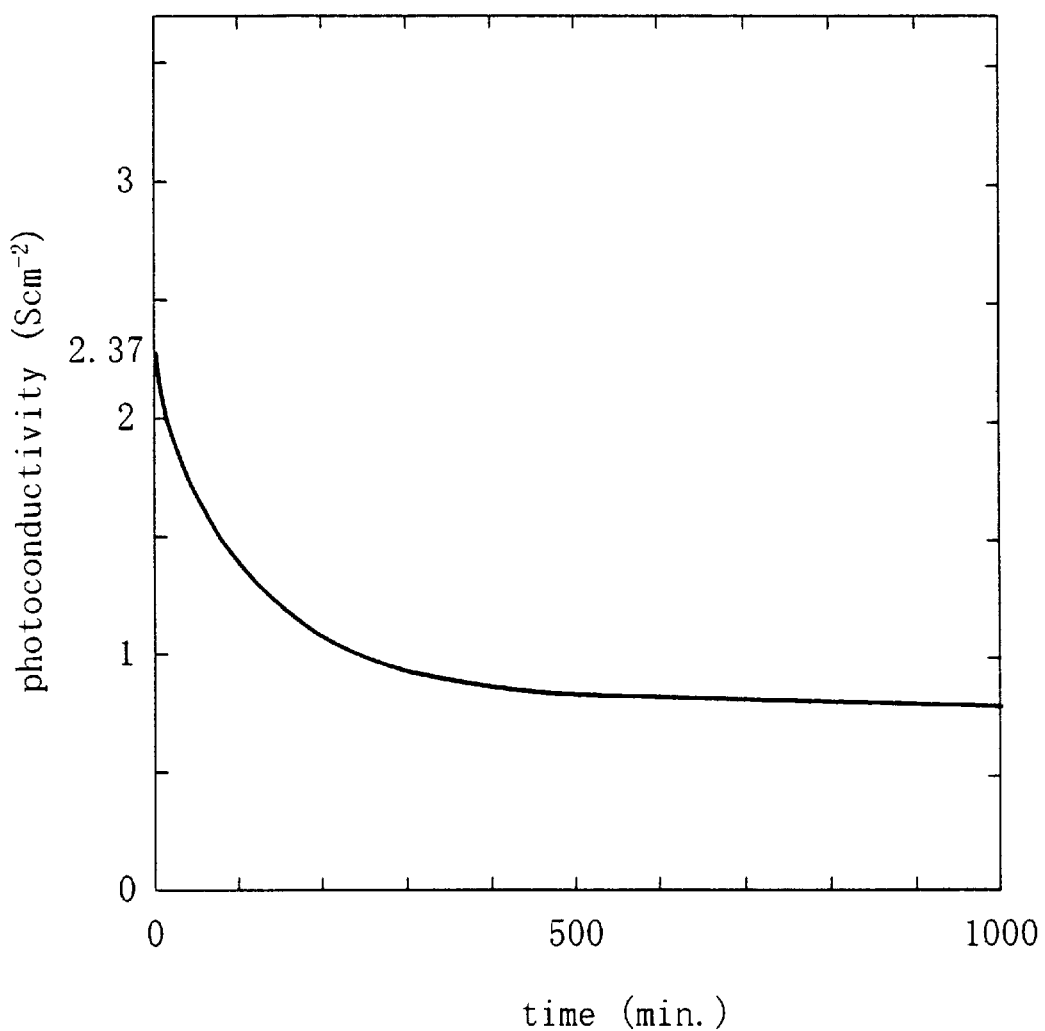
FIG. 3 is a graph showing a relationship between the photoconductivity of an amorphous silicon thin film not subjected to the cyano process and exposure time according to a conventional method.

On the other hand, FIG. 3 shows a variation in photoconductivity of an amorphous silicon thin film not subjected to the cyano process. In FIG. 3, the abscissa and ordinate represent the same parameters as in FIG. 2. As shown in FIG. 3, when the amorphous silicon thin film not subjected to the cyano process is exposed to the light, the photoconductivity thereof decreases with time.

As can be seen from the data shown in FIGS. 2 and 3, the S-W effect degradation of an amorphous silicon thin film is suppressible by the cyano process. Moreover, the photoconductivity of the amorphous silicon thin film subjected to the cyano process is higher than that of the amorphous silicon thin film not subjected to the cyano process and yet to be exposed to the light. That is to say, it is believed that the cyano process eliminates factors (e.g., defects and centers of recombination) of the decrease in photoconductivity of the amorphous silicon thin film, which are identifiable in the as-deposited amorphous silicon thin film and, the photoconductivity itself is already higher than usual at the startup time.

Thus, if the amorphous silicon layer with the increased photoconductivity is used as a component of a photoelectric conversion device, higher photoelectric conversion efficiency will be attainable.

Figure 4:
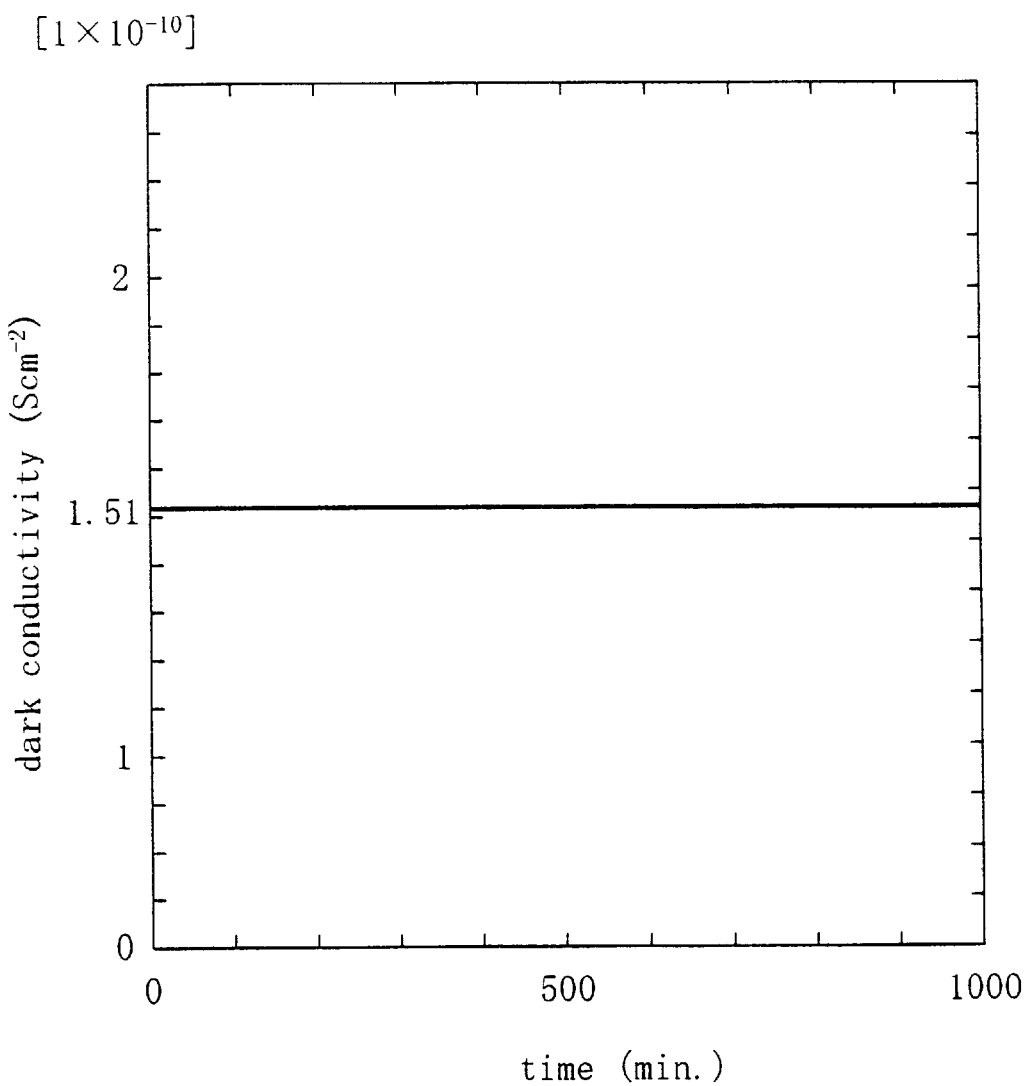
FIG. 4 is a graph showing a relationship between the dark conductivity of the amorphous silicon thin film subjected to the cyano process and exposure time according to the first embodiment.
Figure 5:
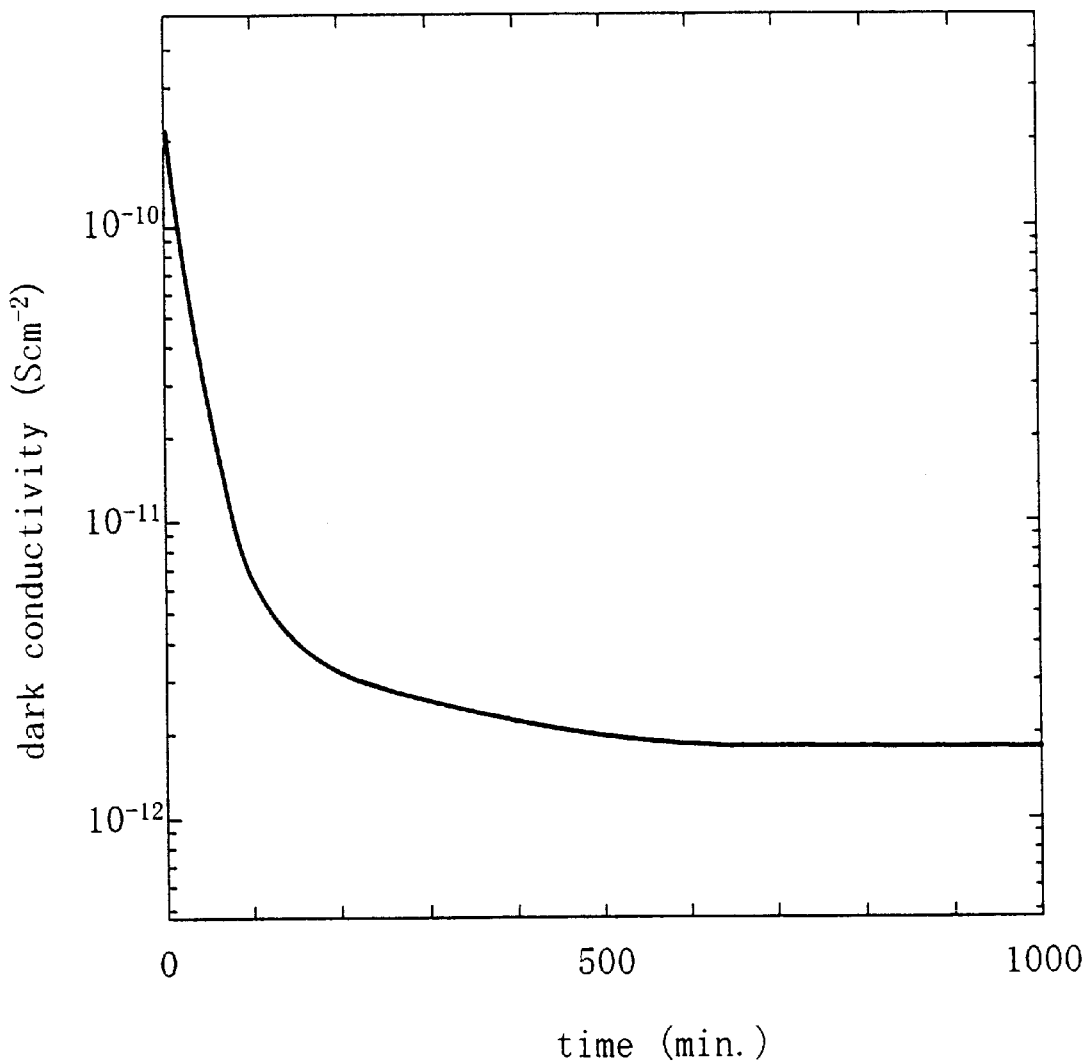
FIG. 5 is a graph showing a relationship between the dark conductivity of the amorphous silicon thin film not subjected to the cyano process and exposure time according to the conventional method.

We also measured the dark conductivity (i.e., electrical conductivity in the absence of light) of the amorphous silicon thin film according to this embodiment. FIG. 4 is a graph showing a relationship between the dark conductivity of the amorphous silicon thin film subjected to the cyano process and exposure time according to this embodiment. Specifically, FIG. 4 shows the data obtained by measuring the dark conductivity of the amorphous silicon thin film after exposing the film to light and then cutting the light off after a predetermined period of time. As shown in FIG. 4, the dark conductivity of the amorphous silicon thin film does not change even upon the exposure to the light after the cyano process. On the other hand, FIG. 5 shows a relationship between the dark conductivity of the amorphous silicon thin film not subjected to the cyano process and exposure time. As shown in FIG. 5, the dark conductivity of the amorphous silicon thin film decreases considerably with time if no cyano process is performed.

In this case, the dark conductivity itself seems to be a factor that hardly contributes to the increase of photoelectric conversion efficiency. However, a stabilized dark conductivity is effective for improvement of properties of electrophotographic photoreceptor and optical sensor. The data shown in FIGS. 4 and 5 shows that the amorphous silicon thin film according to this embodiment effectively eliminates the S-W effect degradation that is inevitable with conventional methods, thus improving the reliability of a device.

Mechanism of Photoconductivity Increase Through Cyano Process

At this time, it is not completely clear even for the present inventors how and why the cyano process suppresses the S-W effect degradation of an amorphous silicon thin film and increases photoconductivity thereof. In the following description, a mechanism which we believe most reasonable will be explained.

(A) Cyano Process Performed Before Exposure to Light

Figure 12A:
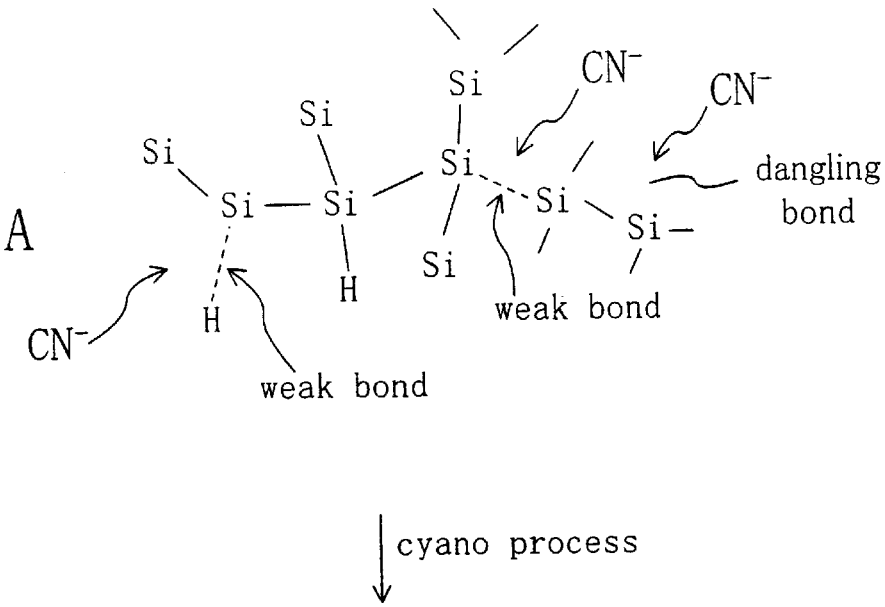
FIGS. 12A and 12B schematically illustrate the bonding of atoms in an as-deposited amorphous silicon thin film and in the film subjected to a cyano process, respectively.
Figure 12B:
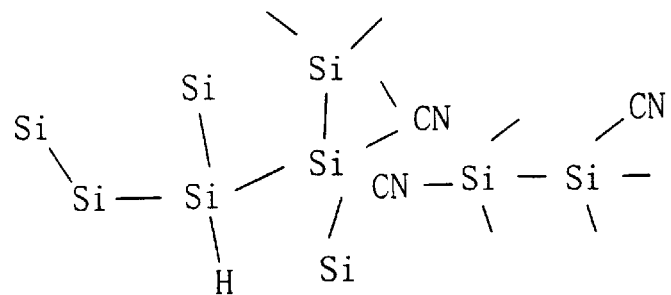

FIGS. 12A and 12B schematically illustrate the bonding of atoms in an as-deposited amorphous silicon thin film and in the film subjected to a cyano process, respectively.

As shown in FIG. 12A, it is believed that most of the dangling bonds, other than adjacent Si atoms bonded together, are terminated with H atoms in the as-deposited hydrogenated amorphous silicon thin film. However, some of those H-terminated bonds may have a low bond energy. Also, even Si—Si bonds may have partly a low bond energy, or be strained greatly. Compared to a crystal structure, an amorphous structure has atoms which are irregularly arranged. Accordingly, there will be a lot of those weak bonds or greatly strained bonds here and there. And, when amorphous silicon is exposed to light, dangling bonds and defect levels will be formed at such bonds. The defect level is an energy level within the bandgap of silicon, and functions as a center of recombination. As a result, photoconductivity decreases, or S-W effect degradation occurs.

However, as shown in FIG. 12B, it is believed that, when the amorphous silicon thin film is immersed in a solution containing a cyanide, $CN^-$ ions act on the dangling bonds and the incomplete bonds including the weak bonds and greatly-strained bonds, thereby forming Si—CN bonds. The Si—CN bonds are strong and are not broken even when exposed to light. That is to say, the incomplete bonds and dangling bonds are inactivated when exposed to light, thus stabilizing the amorphous silicon thin film. In other words, the film is not affected by the S-W effects even upon exposure to light. It is also believed that the photoconductivity increases because defect levels, which are observable in the amorphous silicon thin film before exposed to light, disappear or greatly decrease their number. Furthermore, $CN^-$ ions are relatively small and can readily enter the amorphous silicon thin film from the surface thereof. Then, the $CN^-$ ions act on those incomplete bonds in the amorphous silicon thin film to inactivate the bonds.

(B) Cyano Process Performed After Exposure to Light

Figure 13A:
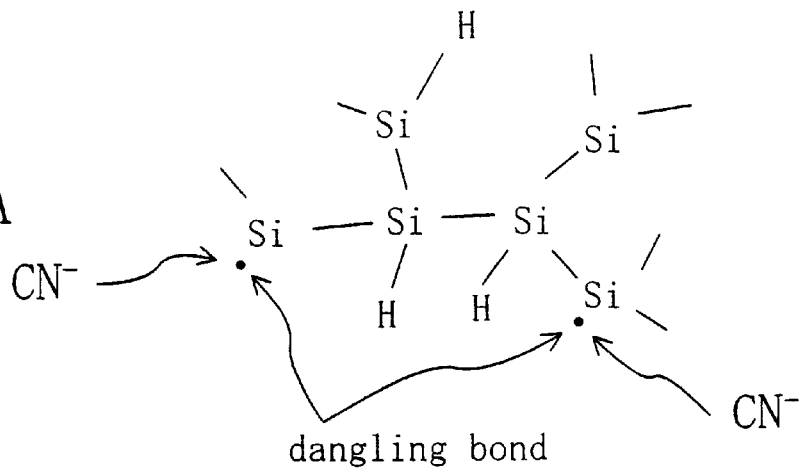
FIGS. 13A and 13B schematically illustrate the bonding of atoms in an as-exposed amorphous silicon thin film and in the film just subjected to the cyano process after the exposure, respectively.
Figure 13B:
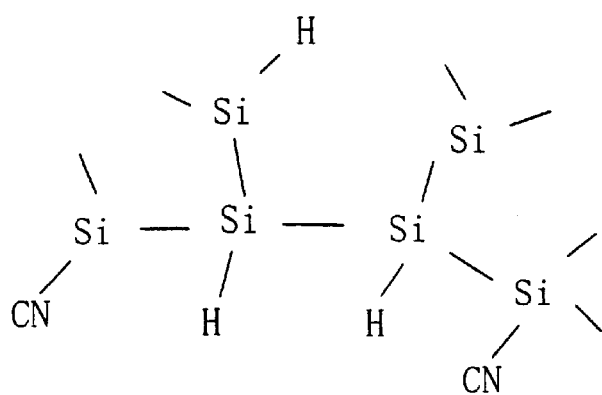

FIGS. 13A and 13B schematically illustrate the bonding of atoms in an as-exposed amorphous silicon thin film, and the film just subjected to the cyano process after the exposure, respectively.

As shown in FIG. 13A, when the amorphous silicon thin film is exposed to light, the bonds are broken and defects such as dangling bonds are formed in those incomplete bonds including the weak bonds and the greatly-strained bonds. The defects such as dangling bonds have energy levels located within the bandgap of amorphous silicon, thus decreasing the photoconductivity.

On the other hand, as shown in FIG. 13B, when the amorphous silicon thin film is immersed in a solution containing a cyanide, $CN^-$ ions will act on the defects such as the dangling bonds to form Si—CN bonds. As a result, the photoconductivity of the amorphous silicon thin film rises and will not decrease even upon exposure to light afterwards.

Embodiment 2

In this embodiment, a process for recovering the photoconductivity of an amorphous silicon thin film, in which the S-W effect degradation occurs upon exposure to light will be described.

In this embodiment, the amorphous silicon thin film is also formed by the same process as in the first embodiment except for the cyano process. In other words, the amorphous silicon thin film 2 is formed on the glass substrate 1, as shown in FIG. 1C, but has not yet been subjected to the cyano process shown in FIG. 1D.

Figure 6:
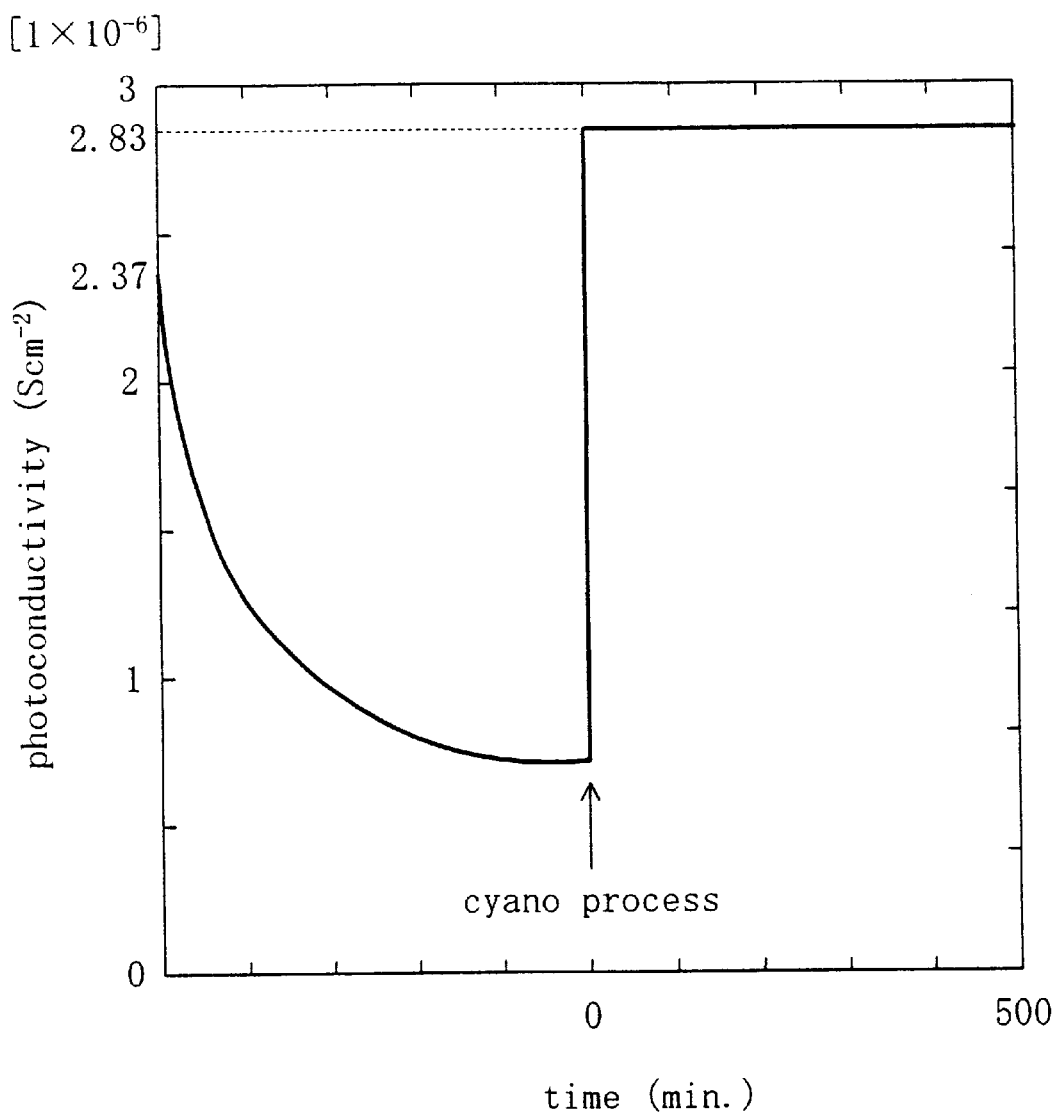
FIG. 6 is a graph showing a relationship between the photoconductivity of an amorphous silicon thin film when exposed to light and exposure time according to a second embodiment of the present invention.

FIG. 6 is a graph showing a relationship between the photoconductivity of an amorphous silicon thin film when exposed to light and exposure time according to this embodiment. In this case, after having been formed on the substrate 1, the amorphous silicon thin film is exposed to pseudo sunlight AM 1.5 with an intensity of 100 $mWcm^{-2}$ for 500 hours. Subsequently, the amorphous silicon thin film is subjected to the cyano process, and then exposed to the light again. This cyano process is performed on the same condition as in the first embodiment shown in FIG. 1D.

As shown in FIG. 6, it is found that even an amorphous silicon thin film, in which the S-W effect degradation occurs upon exposure to light, can recover its photoconductivity through the cyano process. Moreover, the data of FIG. 6 shows that the photoconductivity of the amorphous silicon thin film subjected to the cyano process rises to a level higher than that of the film yet to be exposed to light and will not decrease even upon the exposure to light afterwards.

Accordingly, the cyano process according to this embodiment can increase the photoconductivity of the amorphous silicon thin film in which the S-W effect degradation occurs. That is to say, application of the amorphous silicon thin film according to this embodiment to a solar cell will raise the photoelectric conversion efficiency of the solar cell even if the photoelectric conversion efficiency thereof decreased upon exposure to light during the operation.

Embodiment 3

Hereinafter, a third embodiment of the present invention relating to a solar cell to which an amorphous silicon thin film according to the first embodiment is applied, will be described. FIGS. 7A through 7F are cross-sectional views illustrating a process of fabricating an amorphous silicon solar cell according to this embodiment.

Figure 7A:
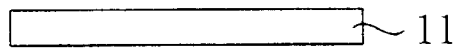
FIGS. 7A through 7F are cross-sectional views illustrating a process of fabricating an amorphous silicon solar cell according to a third embodiment of the present invention.

First, in the step shown in FIG. 7A, an $SnO_2$ substrate 11 made of tin dioxide ($SnO_2$) as a transparent conductor is prepared and cleaned. A substrate made of any other transparent conduction material such as ITO (Indium Thin Oxide) may substitute for the $SnO_2$ substrate.

Figure 7B:
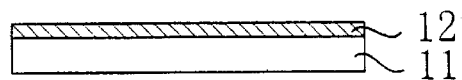

Next, in the step shown in FIG. 7B, the $SnO_2$ substrate 11 is placed in a plasma CVD vacuum chamber having separated three vessels (not shown). Then, the chamber is evacuated to reduce the pressure between $10^{-6}$ Pa and $10^{-8}$ Pa. Subsequently, hydrogen gas and silane gas ($SiH_4$) which is diluted to 10% with hydrogen are supplied into a first reaction vessel of the plasma CVD vacuum chamber so that, the in-vessel pressure increases to about 13 Pa. This silane gas contains 0.1% to several percent (e.g., about 1.5%) of diborane ($B_2H_6$). Trimethylboron ($B(CH)_3$) may substitute for diborane. In this ambient, the temperature of the substrate is kept at 250° C. and a power of about 0.5 Wcm$^{-2}$ is applied at a radio frequency of 13.56 MHz, thereby generating a plasma in the first reaction vessel. By performing this process step, a p-microcrystalline silicon layer 12 with a thickness of about 20 nm is formed on the $SnO_2$ substrate 11.

Figure 7C:
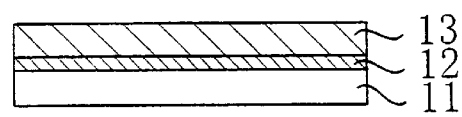

Then, in the step shown in FIG. 7C, the substrate to be processed is moved from the first to a second reaction vessel of the plasma CVD vacuum chamber having separated three vessels (not shown). Subsequently, silane ($SiH_4$) gas is supplied into the second reaction vessel so that the in-vessel pressure increases to about 13 Pa. In this ambient, the temperature of the substrate is kept at about 250° C. and a power of about 0.04 Wcm$^{-2}$ is applied at a radio frequency of 13.56 MHz, thereby generating a plasma in the second reaction vessel. By performing this process step, an i-amorphous silicon layer 13 with a thickness of about 0.5 $\mu$m is formed on the p-microcrystalline silicon layer 12.

Figure 7D:
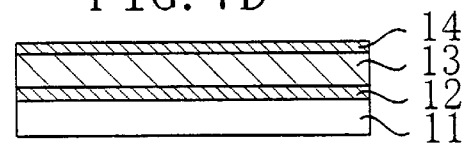

Thereafter, in the step shown in FIG. 7D, the substrate is moved from the second to a third reaction vessel of the plasma CVD vacuum chamber having separated three vessels (not shown). Subsequently, hydrogen gas and silane ($SiH_4$) gas which is diluted to 10% with hydrogen are supplied into the third reaction vessel so that the in-vessel pressure increases to about 13 Pa. This silane gas contains 0.1% to several percent (e.g., about 1.5%) of phosphine ($PH_3$). In this ambient, the temperature of the substrate is kept at 320° C. and a power of about 0.5 Wcm$^{-2}$ is applied at a radio frequency of 13.56 MHz, thereby generating a plasma in the third reaction vessel. By performing this process step, an n-microcrystalline silicon layer 14 with a thickness of about 20 nm is formed on the i-amorphous silicon layer 13.

Figure 7E:
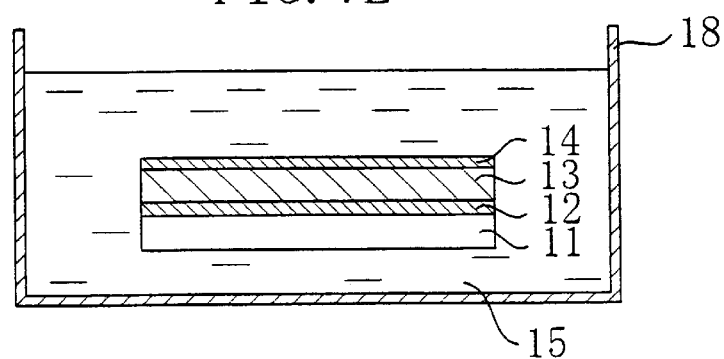

Subsequently, in the step shown in FIG. 7E, the substrate is unloaded from the plasma CVD vacuum chamber having separated three vessels and is immersed for two minutes in an aqueous solution 15, containing potassium cyanide at a concentration of 0.01 mole and at a temperature of 25° C., in a process vessel 18. Then, the substrate is cleaned with ultrapure water at a temperature of 100° C.

Figure 7F:
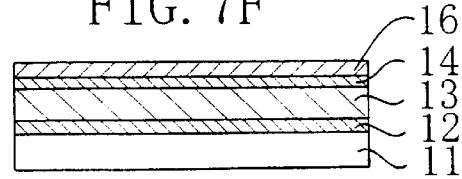

Then, in the step shown in FIG. 7F, an aluminum electrode 16, which will be a backside electrode, is formed on the n-microcrystalline silicon layer 14.

In this case, the cyano process shown in FIG. 7A may be performed after the formation of the aluminum electrode 16.

Though the subsequent steps are not shown, a solar cell including the i-amorphous silicon layer 13 with almost no S-W effect degradation can be obtained by extending lead wires from the aluminum electrode 16 and the $SnO_2$ substrate 11.

We confirmed that the i-amorphous silicon layer 13 also showed no S-W effect degradation in the amorphous silicon solar cell according to this embodiment as in the first embodiment. This is probably because $CN^-$ groups can reach the amorphous silicon layer 13 covered with the n-microcrystalline silicon layer 14. Thus, according to this embodiment, the amorphous silicon solar cell includes the i-amorphous silicon layer 13 with no S-W effect degradation and high photoconductivity. Accordingly, the photoelectric conversion efficiency of the amorphous silicon solar cell will not decrease, but can be sufficiently high even after the exposure to light.

Embodiment 4

Hereinafter, a fourth embodiment of the present invention relating to an integrated amorphous silicon solar cell will be described.

Figure 8:
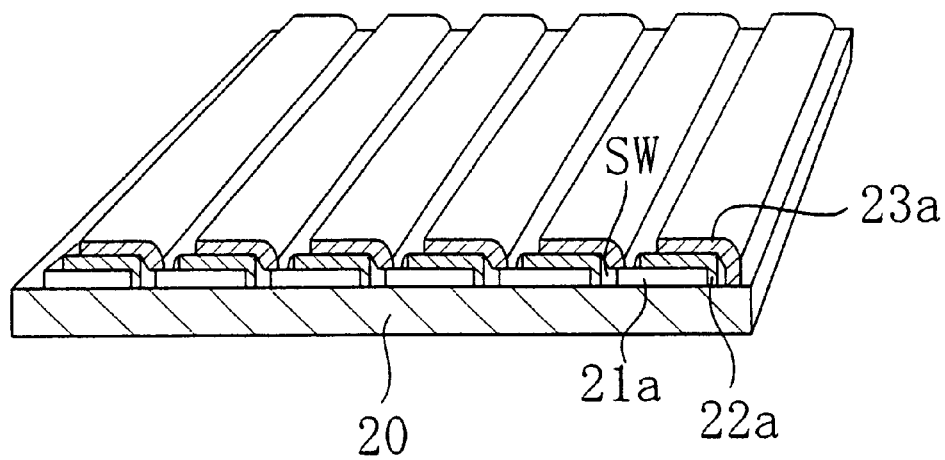
FIG. 8 is a cross-sectional view illustrating a part of an integrated amorphous silicon solar cell according to a fourth embodiment of the present invention.

FIG. 8 is a cross-sectional view illustrating a part of the integrated amorphous silicon solar cell according to this embodiment. As shown in FIG. 8, many cells are integrated on a glass substrate 20. Each of the cells comprises a transparent electrode 21a made of a transparent conductor (Transparent Conductive Oxide, e.g., TCO) such as tin dioxide ($SnO_2$), a semiconductor layer 22a including an amorphous silicon layer, insulator sidewalls SW formed on both sides of the semiconductor layer 22a, and a backside electrode 23a made of a metal such as aluminum.

Figure 9:
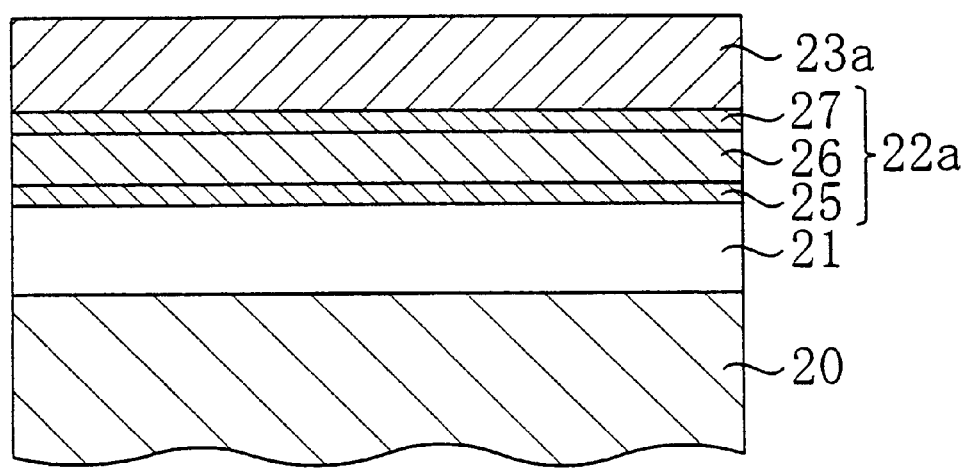
FIG. 9 is a cross-sectional view showing, on a larger scale, part of a cell for the solar cell illustrated in FIG. 8.

FIG. 9 is a cross-sectional view showing, on a larger scale, part of one cell illustrated in FIG. 8. As shown in FIG. 9, the semiconductor layer 22a is separated into three layers. Specifically, the semiconductor layer 22a has a multi-layer structure in which a p-microcrystalline silicon layer 25 doped with boron as a p-type impurity, a non-doped i-amorphous silicon layer 26, and an n-microcrystalline silicon layer 27 doped with phosphorus as an n-type impurity, are stacked in this order on the transparent electrode 21a.

Further, the backside electrode 23a of each cell is connected not only to the n-microcrystalline silicon layer 27 as the uppermost part of the semiconductor layer 22a but also to the transparent electrode 21a of another adjacent cell. That is to say, the solar cell has a structure in which all the cells are connected in series together.

In this case, the transparent electrode 21a may be made of ITO (Indium Tin Oxide) instead of $SnO_2$. The backside electrode 23a may be made of any other metal such as stainless steels, not aluminum.

FIGS. 10A through 10D are cross-sectional views illustrating respective process steps of fabricating an amorphous silicon solar cell that are performed until a cyano process is conducted according to this embodiment. FIGS. 11A through 11C are cross-sectional views showing subsequent process steps of fabricating the amorphous silicon solar cell that are performed after the cyano process is conducted and until the backside electrode is formed according to this embodiment.

Figure 10A:
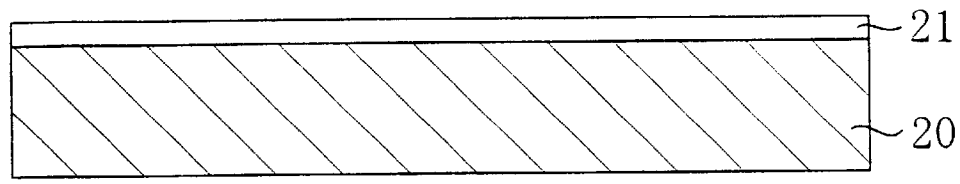
FIGS. 10A through 10D are cross-sectional views illustrating respective process steps of fabricating an amorphous silicon solar cell that are performed until a cyano process is conducted according to the fourth embodiment.
Figure 10B:
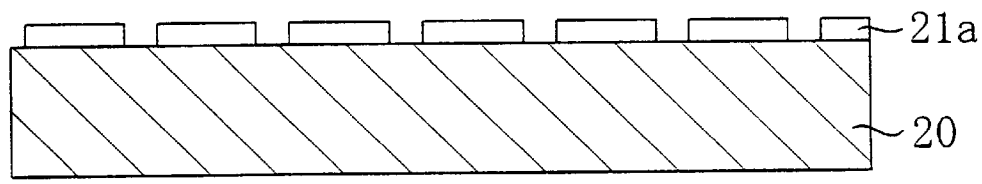
Figure 11A:
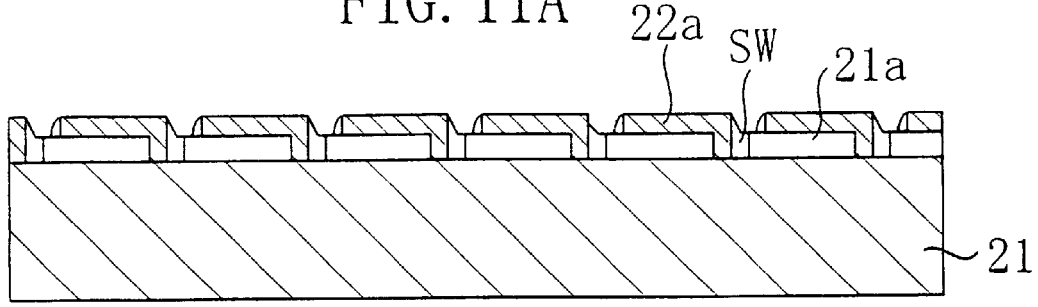
FIGS. 11A through 11C are cross-sectional views showing subsequent process steps of fabricating the amorphous silicon solar cell that are performed after the cyano process is conducted and until a backside electrode is formed according to the fourth embodiment.
Figure 11B:
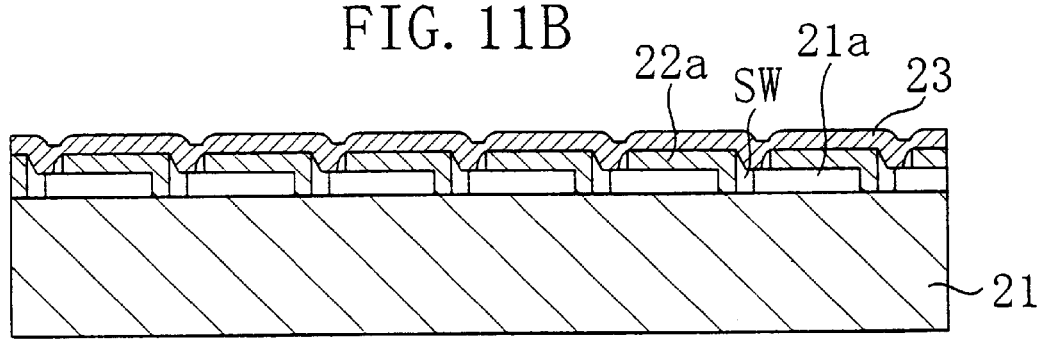
Figure 11C:
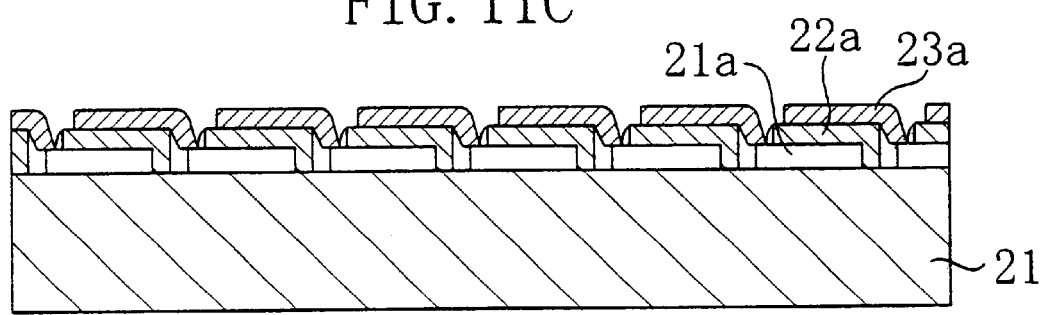

First, in the step shown in FIG. 10A, an $SnO_2$ film 21 is formed over a glass substrate 20 by a vacuum evaporation process. Then, in the step shown in FIG. 10B, the $SnO_2$ film 21 is patterned to form the transparent electrodes 21a. In this case, the $SnO_2$ film 21 may be patterned by any of the following methods. According to a method, after a metal mask or resist mask, covering portions to be the transparent electrodes 21a, has been defined on the $SnO_2$ film 21, the $SnO_2$ film 21 may be etched. According to another method, a pattern of the transparent electrodes 21a may be obtained by removing the $SnO_2$ film 21 selectively with a laser beam.

Figure 10C:
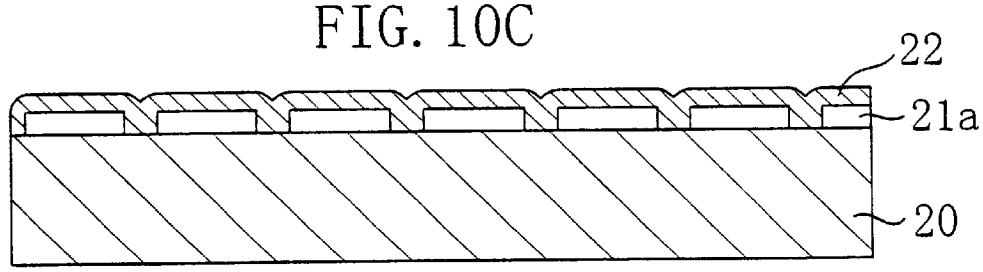

Next, in the step shown in FIG. 10C, a stacked layer 22 having the structure shown in FIG. 9 is deposited over the substrate. This process step is performed as already explained in the third embodiment. Specifically, a substrate to be processed is placed in a plasma CVD vacuum chamber having separated three vessels (not shown). Then, the p-microcrystalline silicon layer 25 with a thickness of about 20 nm, the i-amorphous silicon layer 26 with a thickness of about 0.5 $\mu$m, and the n-microcrystalline silicon layer 27 with a thickness of about 20 nm are formed in the first, second, and third reaction vessels of the chamber, respectively. These layers are formed on the same conditions as specified in the third embodiment.

Figure 10D:
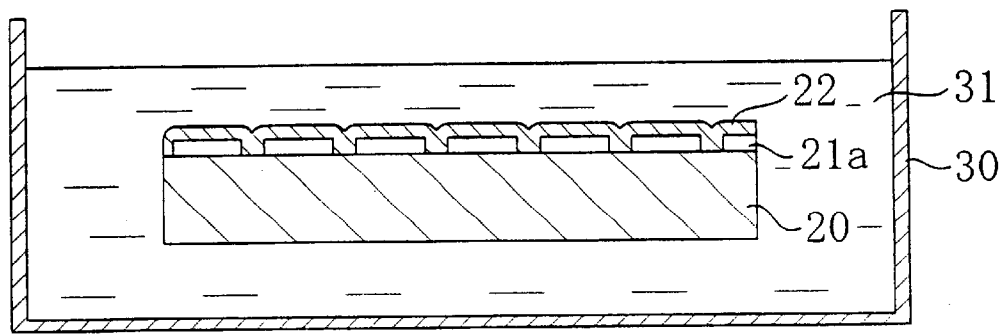

Then, in the step shown in FIG. 10D, the substrate to be processed is unloaded from the plasma CVD vacuum chamber having separated three vessels and is immersed for two minutes in an aqueous solution 31, containing potassium cyanide at a concentration of 0.01 mole and at a temperature of 25° C., in a process vessel 30. Subsequently, the substrate is cleaned with ultrapure water at a temperature of 100° C.

Furthermore, in the step shown in FIG. 11A, the stacked layer 22 is patterned and separated into multiple parts for respective cells, thereby forming the semiconductor layer 22a that covers the top and one side of the transparent electrodes 21a. Then, a silicon dioxide film is deposited over the entire surface of the substrate and then etched back anisotropically to form the insulator sidewalls SW on both sides of the respective parts of the semiconductor layer 22a.

Thereafter, in the step shown in FIG. 11B, an aluminum film 23 is deposited over the entire surface of the substrate. Then, in the step shown in FIG. 11C, the aluminum film 23 is patterned to form the backside electrode 23a. In this case, the backside electrode 23a of one cell extends from the n-microcrystalline silicon layer 27 in the semiconductor layer 22a through one of the insulator sidewalls SW to reach the transparent electrode 21a of another adjacent cell. In other words, the backside electrode 23a of the former cell is in contact not only with the n-microcrystalline silicon layer 27 as the uppermost part of the semiconductor layer 22a but also with the transparent electrode 21a of the latter cell.

In this case, the cyano process shown in FIG. 10D may be performed after the step shown in FIGS. 11B or 11C.

By performing these process steps, the integrated amorphous silicon solar cell shown in FIG. 8 is completed.

The integrated amorphous silicon solar cell and the method of fabricating the cell according to this embodiment readily realizes a solar cell structure that can supply a desired voltage. Moreover, as in the third embodiment, the integrated amorphous silicon solar cell according to this embodiment also can increase the photoelectric conversion efficiency and suppress the decrease in the photoelectric conversion efficiency due to the decrease in photoconductivity.

Embodiment 5

Figure 14:
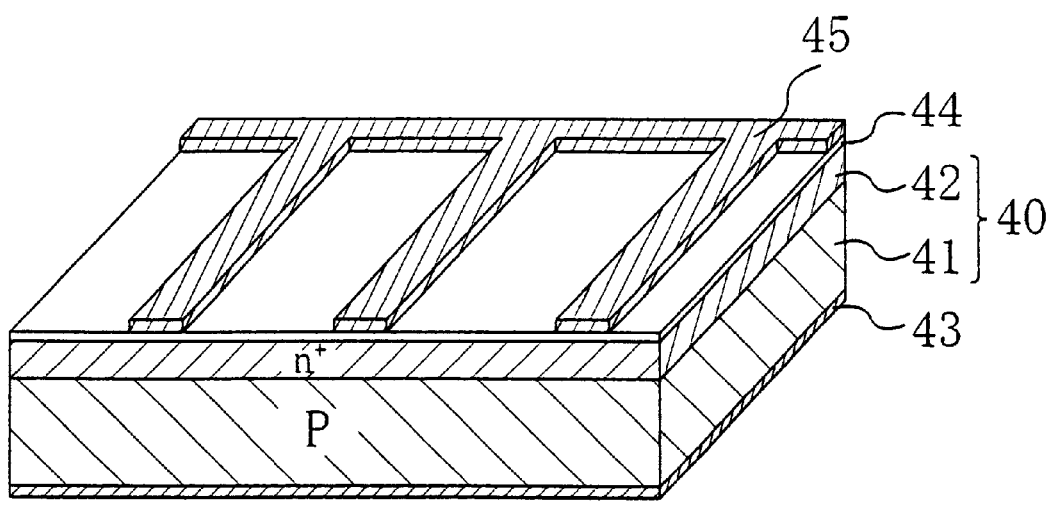
FIG. 14 is a perspective view illustrating a structure for a solar cell according to a fifth embodiment of the present invention.

Hereinafter, a fifth embodiment of the present invention relating to a solar cell using single crystalline silicon or polysilicon will be described. FIG. 14 is a perspective view illustrating a structure of the solar cell of this embodiment.

As shown in FIG. 14, the solar cell of this embodiment comprises a silicon layer 40 having a pn junction. The silicon layer 40 is formed by stacking a p-silicon layer 41, made of single crystalline silicon or polysilicon and doped with a p-type impurity (e.g., boron), and an $n^+$-silicon layer 42, made of single crystalline silicon or polysilicon and doped with an n-type impurity (e.g., phosphorus). A backside electrode 43 is formed on the bottom of the p-silicon layer 41. An antireflection coating 44, made of an insulator (e.g., a silicon dioxide film) having a different refractive index from that of silicon, is formed on the $n^+$-silicon layer 42. A finger electrode 45 is formed on the coating 44 and is in contact with the $n^+$-silicon layer 42 through openings formed in parts of the antireflection coating 44.

According to this embodiment, the following process steps may be performed to manufacture the solar cell. First, the silicon layer 40 is formed by diffusing dopants in a single crystalline silicon thin plate or polysilicon ribbon, for example. Then, as in the second and third embodiments, the plate or ribbon is immersed in an aqueous solution, containing a cyanide such as potassium cyanide, in a process vessel. After performing this cyano process, the antireflection coating 44, finger electrode 45, and backside electrode 43 are formed. Alternatively, the cyano process may be performed immediately after the antireflection coating 44 or finger electrode 45 has been formed.

Thus, in the single crystalline silicon or polysilicon solar cell according to this embodiment, dangling bonds in the p- and $n^+$-silicon layers 41 and 42 can be terminated by the cyano process. As a result, the p- and $n^+$-silicon layers 41 and 42 show a high photoconductivity and no S-W effect degradation. Accordingly, the photoelectric conversion efficiency of the solar cell will not decrease, but can be kept sufficiently high even after the exposure to light.

Especially in the polysilicon solar cell, the S-W effect degradation is very likely to be caused by sunlight, because a large number of dangling bonds exist in grain boundaries of polysilicon, for example. However, the cyano process according to this embodiment terminates the dangling bonds with $CN^-$ groups. As a result, the polysilicon thin film can recover its photoconductivity even if the thin film has been degraded by the S-W effects.

Other Embodiments

In the third and fourth embodiments, the p- and n-microcrystalline silicon layers are formed on the bottom and top of the i-amorphous silicon layer, respectively. However, both or one of the microcrystalline silicon layers is not always necessary. This is because electrical charge may be lead to the electrode through a Schottky junction or ohmic contact between the metal and i-amorphous silicon layers.

Further, in the third and fourth embodiments, instead of the microcrystalline silicon layers, a semiconductor layer(s) made of, for example, p- and n-amorphous silicon may be formed under and/or over the i-amorphous silicon layer.

Moreover, an i-microcrystalline silicon layer may be formed instead of the i-amorphous silicon layer in the third and fourth embodiments.

In the pn junction silicon layer 40 of the fifth embodiment, the p-silicon layer 41 is in direct contact with the $n^+$-silicon layer 42. However, the silicon layer may have a pin junction by interposing an i-silicon layer between the p- and $n^+$-silicon layers 41 and 42.

In the foregoing embodiments, only a technique of immersing the substrate to be processed, including the amorphous silicon layer, in a solution containing cyano ions is disclosed as an exemplary cyano process. However, the same advantages can be obtained by any of the following methods. According to a method, a solution containing cyano ions such as KCN and NaCN ions may be supplied onto the surface of the substrate. According to another method, a solution containing cyano ions may be sprayed upon the surface of the substrate.

In the second through fifth embodiments, solar cell structures are explained as silicon photoelectric conversion devices. However, the present invention is not limited to these embodiments, but is applicable to various other kinds of silicon photoelectric conversion devices such as a photosensitive drum used for a copying machine and a thin film transistor (TFT).

The photoelectric conversion devices such as the TFT can be fabricated by further forming an insulator layer between the amorphous silicon, polysilicon, or microcrystalline silicon layer and the conductor layer. In this case, the insulator layer is preferably made of at least one material selected from the group consisting of silicon dioxide ($SiO_2$), silicon monoxide (SiO), trisilicon tetranitride ($Si_3N_4$), silicon oxynitride, titanium dioxide ($TiO_2$), aluminum trioxide ($Al_2O_3$) and tungsten trioxide ($WO_3$).

In the third and fourth embodiments, the substrate may be made of an opaque metal such as aluminum and stainless steel, and the electrode may be made of a transparent conductor (e.g., TCO).

In the third, fourth, and fifth embodiments, the glass substrate may be replaced by a plastic film or a plastic film with a stainless steel or aluminum film formed thereon.

What is claimed is:

1. A method of processing a silicon photoelectric conversion device, the method comprising the steps of:
   a) preparing a substrate to be processed including a silicon layer and an upper semiconductor layer formed on the silicon layer;
   b) preparing a process solution containing cyano ions ($CN^-$); and
   c) performing a cyano process on the upper semiconductor layer for introducing the cyano ions ($CN^-$) into the upper semiconductor layer of the substrate using the solution.

2. The method of claim 1, wherein the silicon layer is made of at least one material selected from the group consisting of amorphous silicon, polysilicon, microcrystalline silicon and single crystalline silicon.

3. The method of claim 1, wherein the upper semiconductor layer is made of at least one material selected from the group consisting of p- or n-microcrystalline silicon, p- or n-amorphous silicon, p- or n-polysilicon and p- or n-single crystalline silicon.

4. A method of processing a silicon photoelectric conversion device, the method comprising the steps of:
   a) preparing a substrate to be processed including a silicon layer and an insulator layer formed on the silicon layer;
   b) preparing a process solution containing cyano ions ($CN^-$); and
   c) performing a cyano process on the insulator layer for introducing the cyano ions ($CN^-$) into the insulator layer of the substrate using the solution.

5. The method of claim 4, wherein the silicon layer is made of at least one material selected from the group consisting of amorphous silicon, polysilicon, microcrystalline silicon and single crystalline silicon.

* * * * *